United States Patent [19]
Ochi

[11] 4,401,901
[45] Aug. 30, 1983

[54] COMPARATOR

[75] Inventor: Sam S. Ochi, Cupertino, Calif.

[73] Assignee: Advanced Micro Devices, Inc., Sunnyvale, Calif.

[21] Appl. No.: 269,936

[22] Filed: Jun. 1, 1981

[51] Int. Cl.[3] .......................... H03K 5/24; H03K 5/08
[52] U.S. Cl. .................................. 307/362; 307/264; 307/291; 307/475
[58] Field of Search ............. 307/264, 354, 362, 475, 307/289, 291; 330/252, 255, 261

[56] References Cited
U.S. PATENT DOCUMENTS 3,651,421 3/1972 Beelitz .............................. 330/261
4,056,740 11/1977 Schoeff ............................. 307/362

*Primary Examiner*—John Zazworsky
*Attorney, Agent, or Firm*—Gary T. Aka; Patrick T. King

[57] ABSTRACT

A high speed, low power, latching, difference amplifier giving Feedback Emitter Coupled Logic level output voltages. The comparator operates with low voltage swings between logic levels to minimize propagation delay and heat dissipation. Efficiency is aided by diverting unneeded current away from the input stage to the latch stage during the latch enabled state, and the input slew rate to the comparator is effectively increased by clamping the input terminals with Schottky diodes. The amplifier works on a restricted common mode range, and normally has its reference voltage input grounded, although other reference voltages may be used. The output can be either positive or negative true. Propagation delay is under 4 nanoseconds, minimum sensitivity is 5 millivolts, and heat dissipation is under 50 milliwatts.

8 Claims, 1 Drawing Figure

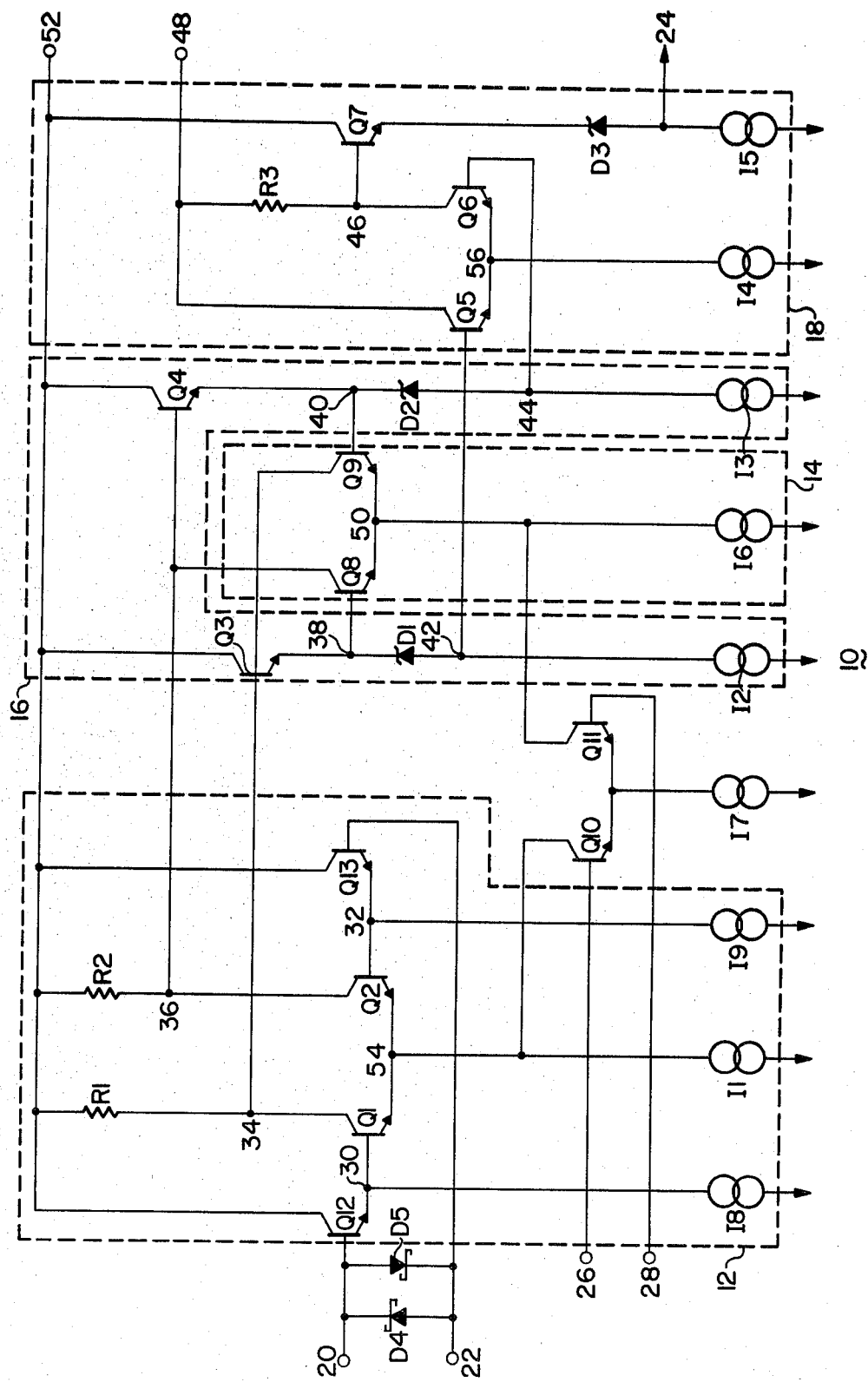

COMPARATOR

BACKGROUND OF THE INVENTION

The present invention generally relates to differential amplifiers, and in particular to a low power high speed precision comparator.

Comparators are typically employed as an interface between analog signal intelligence and a logic system, or as a circuit means for detecting low level logic signals in the presence of noise. Comparators normally accept two analog input signals and provide an output signal therefrom indicating whether the difference between the input signals is positive or negative. If the output signal is to be at Transistor-Transistor Logic (TTL) levels, there is a fixed high gain requirement from the minimum input voltage to the digital output voltage which normally requires large voltage swings in each amplifier stage. Reduced propagation times are generally desirable but require a high input device slew rate and large overdrive voltages, both of which are obtained at the expense of increased power consumption and heat dissipation. The maximum heat dissipation capacity of integrated circuit packages usually limits the use of comparators in monolithic form. To meet the requirements for comparators in very high speed analog-to-digital (A/D) converters, for example, designers have resorted to complex and costly circuitry, thereby precluding numerous potential applications for comparators.

It is well known that another logic form, Feedback Emitter Coupled Logic (FECL), will operate with smaller voltage swings (130 millivolts versus 2 volts), and hence will operate much faster than TTL. If an integrated circuit used FECL logic levels, at least internally with TTL level output signals, then a dedicated comparator producing lower level (e.g., FECL) output voltages and requiring less power could be incorporated into a monolithic integrated circuit device, such as an A/D converter. However, because of noise problems and temperature sensitivity, FECL compatible devices have not previously been exploited. There is thus a need for a very high speed comparator operating with low voltage swings.

SUMMARY OF THE INVENTION

It is therefore an object of the present invention to provide a comparator delivering FECL compatible output voltage levels.

It is another object of the present invention to provide a comparator with a small propagation delay, typically under 4 nanoseconds.

It is a further object of the present invention to provide a comparator which dissipates low wattage, typically less than 50 milliwatts.

It is a still further object of the present invention to provide a comparator with latching capabilities.

An integrated circuit apparatus is provided which is responsive to an unknown input voltage relative to a reference voltage, for providing a digital output voltage at first and second values in accordance with the polarity of the unknown input voltage with respect to the reference voltage. The circuit apparatus comprises an input gain stage having at least one input terminal thereof for receiving the unknown input voltage, an output terminal thereof, the input gain stage being disposed for amplifying the difference between the amplitude of the unknown input voltage and that of the reference voltage; a voltage shift stage having an input terminal coupled to the output terminal of the input gain stage, an output terminal thereof, the voltage shift stage being disposed for translating at a constant rate of translation output signal levels from the input gain stage to second levels relative to the level of the output signal of the input gain stage; and, an output gain stage having an input terminal coupled to the output terminal of the voltage shift stage, an output terminal for providing the digital output voltage values of the circuit apparatus, the output gain stage being disposed for amplifying the translated signal levels from the voltage shift stage and further being disposed for translating such signal levels so as to maintain a prescribed voltage differential between the first and second digital output voltage values.

DETAILED DESCRIPTION

Referring now to the drawing, a schematic diagram of the comparator 10 of this invention is shown which comprises an input signal gain stage 12, a latch stage 14, a level shift stage 16, and an output signal gain and level shift stage 18.

The input signal stage 12 includes a pair of transistors Q12 and Q13 having their base terminals connected to the input terminals 20 and 22 respectively, their emitter terminals connected through circuit nodes 30 and 32 to current sources I8 and I9 respectively, typically 400 microamps each, and their collector terminals both connected to positive supply voltage terminal 52, typically +5 volts. The emitter terminals of transistors Q12 and Q13 are also connected through the circuit nodes 30 and 32 to the base terminals of transistors Q1 and Q2, respectively. The emitter terminals of the transistors Q1 and Q2 are connected together through a circuit node 54 to a current source I1, which is typically 400 microamps. The collector terminals of the transistors Q1 and Q2 are connected through the circuit nodes 34 and 36 and through the resistors R1 and R2, respectively, each typically 585 ohms, to the power supply terminal 52.

The unknown analog input signal voltage is applied to the input terminal 20. The comparator senses the relative difference between the unknown signal on the input terminal 20 and a known analog reference voltage applied on the input terminal 22. A logic output signal $\bar{D}_L$ will be provided on an output terminal 24 of the comparator 10 at a logic low level when the voltage on the input terminal 20 is positive with respect to the reference voltage on the input terminal 22, and at a logic high level when the voltage difference is negative. Thus, the output signal from the comparator 10 is always at either a logic high level (one) or a logic low level (zero), whereas the input voltage levels can change continuously.

The circuit operates in either a latched or unlatched mode, as a function of complementary high and low level clock signals alternately applied to clock input terminals 26 and 28. The terminals 26 and 28 are coupled, respectively, to base terminals of transistors Q10 and Q11, which have their emitter terminals coupled together and to a current source I7, typically 1 milliamp. The collector terminal of the transistor Q10 is coupled to the circuit node 54, and the collector terminal of the transistor Q11 is coupled to a circuit node 50 in the latch stage 14 to be described further hereinafter.

In the unlatched mode, the output signal is dependent upon the comparator input voltage levels, and in the latched mode, the output signal is independent of the input signals. The circuit will be described first in the unlatched mode resulting from a low level clock signal where the voltage at the clock input terminal 28 is a logic swing lower than the voltage present on the clock input terminal 26.

The known reference voltage present on the input terminal 22 is typically ground. The comparator input terminals 20 and 22 are clamped by low capacitance Schottky diodes D4 and D5 which limit the comparator input differential overdrive to plus or minus one Schottky diode drop. This has the effect of reducing the slew rate required of a device (e.g., a digital-to-analog converter) providing input signals to the comparator. Transistor differential pair Q1 and Q2 operate at a high bias current I1+I7 (by means of the transistor Q10), typically 1.4 milliamps. This allows resistors R1 and R2 to be small so that the time delay through the input stage is at a minimum. Transistors Q1 and Q2 are isolated or buffered from the input terminals 20 and 22 by the Darlington connected emitter follower transistors Q12 and Q13 so as to increase the comparator input impedance while maintaining the input bias currents relatively constant through the comparison point. Transistors Q12 and Q13 operate at the relatively low bias currents of the current sources I8 and I9, typically of 400 microamps each.

The circuit operation will be described for the case where the input terminal 20 is positive or high with respect to the input terminal 22 or ground. Because transistors Q12 and Q13 are emitter followers, the voltage present on circuit node 30 (emitter of Q12) will be high with respect to that at a circuit node 32 (emitter of Q13). Transistor Q1 conducts more of the I1+I7 bias current than does the transistor Q2 thereby causing a voltage drop across the resistor R1 so that the voltage at a circuit node 34 (collector of Q1) is low with respect to that at a circuit node 36 (collector of Q2). The voltage difference between the circuit nodes 34 and 36 is the voltage difference between the input terminals 20 and 22 multiplied by the input stage gain. The voltages at circuit nodes 34 and 36 will be near the positive supply voltage, and must then be shifted down towards the negative supply voltage (which is typically −5 volts), for FECL compatibility.

The level shift stage 16 includes the transistors Q3 and Q4 which have their base terminals connected to the circuit nodes 34 and 36, respectively, and their collector terminals connected to the voltage supply terminal 52. The emitter terminals of the transistors Q3 and Q4 are connected through the circuit nodes 38 and 40 and to the cathodes of a pair of Zener diodes D1 and D2, respectively. The anodes of the diodes D1 and D2 are connected through the circuit nodes 42 and 44 to current sources I2 and I3, respectively, which are typically 400 microamps each. For purposes of the example under discussion, the voltage swing developed across the resistor R1 is buffered in the level shift stage 16 by the emitter follower transistor Q3 from the level shifting Zener diode D1 and from the latch stage 14 transistor Q8. The voltage difference between the circuit nodes 34 and 36 appears between the circuit nodes 38 and 40 (emitters of Q3 and Q4, respectively) and appears between the circuit nodes 42 and 44 (anodes of D1 and D2, respectively). The transistors Q3 and Q4 in combination with the Zener diodes D1 and D2 shift the voltage level present on the circuit nodes 34 and 36, which is near the positive supply voltage, to a lower level, (voltage at the node 34 minus Q3 voltage (0.7 V) minus D1 voltage (6.3 V)), and apply this level-shifted voltage to the circuit nodes 42 and 44, respectively. Such voltage level shifting is made for the purpose of FECL output level compatibility and, for worst case, power supply variations. The voltage difference between the nodes is maintained at a constant. By way of example, assume the voltage on the node 34 is plus 4 volts (+4 V) and the voltage on the node 36 is +5 V, then the shifted-level voltage present on the node 42 is negative 3 volts (−3 V) and the voltage present on the node 44 is negative 2 volts (−2 V).

The latch 14 includes the transistors Q8 and Q9, which have their bases connected to the circuit nodes 38 and 40, respectively, their collectors cross-coupled to the circuit nodes 36 and 34 (bases of Q4 and Q3), respectively, and their emitters connected together through the circuit node 50 to current source 16 which is typically 100 microamps. In the unlatched mode, transistors Q8 and Q9 have no practical effect.

Transistors Q5, Q6 and Q7, current source I4 of typically 400 microamps, current source I5 of typically 600 microamps, resistor R3 of typically 415 ohms and Zener diode D3, form the output gain stage 18. Transistors Q5 and Q6 have their base terminals connected to the circuit nodes 42 and 44, respectively, and their emitter terminals connected together through the circuit node 56 to current source I4, which is typically 400 microamps. The collector of the transistor Q5 is connected to a bias voltage supply terminal 48, which is typically 3.2 volts (FECL voltage (−3.8 V) on the terminal 24 plus the voltage drop across base-emitter of Q7 (+0.7 V) plus the Zener diode D3 voltage drop (+6.3 V)=3.2). The collector of a transistor Q6 is connected through resistor R3 to the voltage supply terminal 48. The base of a transistor Q7 is connected through the circuit node 46 to the collector of the transistor Q6. The collector of the transistor Q7 is connected to the 5 volt supply terminal 52, and the emitter terminal of the transistor Q7 is connected to the cathode of a Zener diode D3. The anode of the diode D3 is connected to a current source I5, which is typically 600 microamps. The voltage difference between the circuit nodes 42 and 44 is applied to the base terminals of the transistors Q5 and Q6. This voltage difference is adequate to steer substantially all of the bias current from the source I4 through the transistor Q6 so that the voltage at a circuit node 46 (base of Q7) is low with respect to the voltage present on the terminal 48 (collector of Q5). An FECL compatible output logic swing is determined by the value of the resistor R3 and the bias current from the source I4. The current from the source I5 flows through the transistor Q7 and the Zener diode D3, which buffer and level shift the voltage at the circuit node 46 to give the FECL level (typically around −3.8 volts) output signal $\overline{D}_L$ at the output terminal 24.

Complementary clock signals are applied through clock signal input terminals 26 and 28 to a current switch formed of the transistors Q10 and Q11, which signals determine whether or not the output signal $\overline{D}_L$ is to be latched. During a high clock pulse the voltage at the clock signal input terminal 28 is a logic swing above the voltage at the clock signal input terminal 26 causing bias current I7, which is typically 600 microamps, to flow through the transistor Q11 and the circuit node 50, thereby enabling the latch 14. The latch captures the sense of the gain stage 12 output signal (the circuit node 34-circuit node 36 voltage polarity, initiating the logic decision) just prior to the clock signal low-to-high voltage transition. While the clock signal voltage is high the logic output signal $\overline{D}_L$ is independent of the analog input signal voltage.

In the present example, the voltage at the circuit node 40 is above the voltage at the circuit node 38, causing the current from the sources I6 and I7 to flow through the transistor Q9 and the resistor R1, further lowering the voltage at the circuit node 34 sufficiently to hold the transistor Q3 in the off state regardless of changes at the signal input terminal 20 until the latch 14 is disabled by a low clock pulse. A low clock pulse disables the latch by diverting the same current from source I7 through the transistor Q10 to the emitters of the input gain stage 12 transistors Q1 and Q2, which increases the sensitivity of the comparator.

The minimum overdrive required by the comparator is ½ of a least significant bit. The minimum overdrive available depends upon the input current to the comparator and the comparator input resistance. With a 2.5K ohm input resistance and 4 milliamps of input current, the voltage overdrive is 20 millivolts. The comparator was designed with adequate gain to respond to a 5 millivolt overdrive in 4 nanoseconds. Response time is independent to the overdrive voltage beyond 5 millivolts applied to its inputs. The comparator is biased by currents that are proportional to temperature. This assures resolution independent of temperature over the military specification range.

The current sources I1 through I9 are formed in a conventional manner by a transistor and resistor coupled to a voltage reference as depicted by the arrows connected to the sources.

Although the invention has been described relative to a specific embodiment, it is not so limited and, in the light of the above teaching, numerous variations and modifications thereof will be readily apparent to those skilled in the art. It is therefore to be understood that within the scope of the appended claims the invention may be practiced otherwise than as specifically described.

What is claimed is:

1. An integrated circuit apparatus responsive to an unknown input voltage relative to a reference voltage, for providing a digital output voltage at first and second values in accordance with the polarity of the unknown input voltage with respect to the reference voltage, said circuit apparatus comprising:
   (a) an input gain stage having at least one input terminal thereof for receiving the unknown input voltage, an output terminal thereof, said input gain stage being disposed for amplifying the difference between the amplitude of the unknown input voltage and that of the reference voltage;
   (b) a voltage shift stage having an input terminal coupled to the output terminal of said input gain stage, an output terminal thereof, said voltage shift stage being disposed for translating at a constant rate of translation output signal levels from said input gain stage to second levels relative to the level of the output signal of said input gain stage;
   (c) an output gain stage having an input terminal coupled to the output terminal of said voltage shift stage, an output terminal for providing the digital output voltage values of said circuit apparatus, said output gain stage being disposed for amplifying the translated signal levels from said voltage shift stage and further being disposed for translating such signal levels so as to maintain a prescribed voltage differential between the first and second digital output voltage values;
   a latch stage having a latch control signal input terminal, said latch stage being coupled to said voltage shift stage for maintaining the signal level in said voltage shift stage in response to a latch enable signal applied to said latch input terminal; and
   a current switch disposed for alternately directing a current through said latch stage and said input gain in response to and as a function of said latch enable signal.

2. An integrated circuit apparatus as in claim 1 further characterized by an input voltage limiting device connected to said input terminal.

3. Differential amplifier responsive to the polarity of an unknown input voltage relative to a reference input voltage, and providing an output voltage at a first level for one polarity and at a second level for the opposing polarity, said differential amplifier comprising:
   a first input terminal for receiving the unknown input voltage, a second input terminal for receiving the reference voltage, power and bias supply voltage sources, at least five current sources;
   an output terminal disposed for supplying said first and second level output voltages;
   an input gain stage formed by a differential pair of first and second transistors having their emitters connected together and to said first current source, having their bases coupled to said first and second input terminals, respectively, and first and second resistance means connected between said power supply voltage and the collectors of said first and second transistors, respectively;
   a voltage shift stage including third and fourth transistors having their bases connected to the collectors of said first and second transistors respectively, and having their collectors connected to said power supply voltage, and including first and second Zener diodes having their cathodes connected to the emitters of said third and fourth transistors, respectively, and their anodes connected to said second and third current sources, respectively;
   an output gain and voltage level shift stage including a third resistor connected on one side to said bias supply voltage, fifth and sixth transistors having their emitters connected together and to said fourth current source, having their bases connected to the anodes of said first and second diodes, respectively, said fifth transistor having its collector connected to said bias supply voltage, said sixth transistor having its collector connected to the remaining side of said third resistor, a seventh transistor having its base connected to the collector of said sixth transistor, its collector connected to said power supply voltage, and a third diode having its cathode connected to the emitter of said seventh transistor and its anode connected to said fifth current source and to said output terminal.

4. The apparatus of claim 3 further including a latch control signal voltage input terminal and a latch stage comprised of eighth and ninth transistors having their emitters connected together and responsive to said latch input terminal and to a sixth current source, their bases connected to the emitters of said third and fourth transistors respectively, and their collectors connected to the bases of said fourth and third transistors respectively.

5. The apparatus of claim 4 further including a second latch control signal input terminal and current switch means, said switch means comprising tenth and eleventh transistors having their emitters connected together and to a seventh current source said tenth transistor having its base connected to said second latch input terminal and its collector connected to the emitters of said first and second transistors, said eleventh transistor being interposed between said first latch input terminal and said latch, said eleventh transistor having its base connected to said first latch input terminal and its collector connected to said eighth and ninth transistor emitters.

6. The apparatus of claim 5 further including an input stage buffer comprised of twelfth and thirteenth transistors interposed between said first and second input terminals and the bases of said first and second transistors, respectively, said twelfth and thirteenth transistors having their respective bases connected to respective input terminals, and their respective emitters connected to the bases of the first and second transistors and to eight and ninth current sources, respectively.

7. The apparatus of claim 6 further including two Schottky diodes connected in parallel and opposing polarities between said first and second input terminals.

8. The apparatus of claim 7 further including clock means for synchronously enabling and disabling said latch by alternating the relative voltages at said first and second latch input terminals.

* * * * *